United States Patent [19]

Vikesland

[11] Patent Number: 4,571,374

[45] Date of Patent: Feb. 18, 1986

[54] MULTILAYER DRY-FILM POSITIVE-ACTING LAMINABLE PHOTORESIST WITH TWO PHOTORESIST LAYERS WHEREIN ONE LAYER INCLUDES THERMAL ADHESIVE

[75] Inventor: John P. Vikesland, Woodbury, Minn.

[73] Assignee: Minnesota Mining and Manufacturing Company, St. Paul, Minn.

[21] Appl. No.: 686,838

[22] Filed: Dec. 27, 1984

[51] Int. Cl.$^4$ .................. G03C 1/54; G03C 1/60; G03C 1/495

[52] U.S. Cl. .................... 430/156; 430/143; 430/166; 430/258; 430/260; 430/271; 430/273; 430/275; 430/259

[58] Field of Search ............ 430/156, 166, 143, 260, 430/258, 271, 273, 275, 259

[56] References Cited

U.S. PATENT DOCUMENTS

| | | | |
|---|---|---|---|
| 3,649,283 | 3/1972 | Christensen et al. | 430/275 |
| 4,180,604 | 12/1979 | Feng et al. | 430/270 |
| 4,191,573 | 3/1980 | Toyama et al. | 430/166 |
| 4,217,407 | 8/1980 | Watanabe et al. | 430/156 |
| 4,247,616 | 1/1981 | Vikesland et al. | 430/192 |
| 4,260,673 | 4/1981 | Krech | 430/156 |
| 4,352,870 | 10/1982 | Howard et al. | 430/156 |
| 4,464,458 | 8/1984 | Chow et al. | 430/156 |
| 4,504,566 | 3/1985 | Dueber | 430/156 |

FOREIGN PATENT DOCUMENTS 1493833 11/1977 United Kingdom ............... 430/160

Primary Examiner—Charles L. Bowers, Jr.
Attorney, Agent, or Firm—Donald M. Sell; James A. Smith; Mark A. Litman

[57] ABSTRACT

Dry-film, positive-acting photoresist layers are used in the formation of many articles such as circuit boards, printing plates and the like. Laminable monolayers of photoresist suffer from slow speeds, brittleness, and narrow latitude during development and exposure. The use of a laminable positive-acting photoresist integral adhesive layer on the dry-film, positive-acting photoresist layer improves the properties and performance of the photoresist.

14 Claims, No Drawings

MULTILAYER DRY-FILM POSITIVE-ACTING LAMINABLE PHOTORESIST WITH TWO PHOTORESIST LAYERS WHEREIN ONE LAYER INCLUDES THERMAL ADHESIVE

FIELD OF THE INVENTION

The present invention relates to laminable dry-film, positive-acting photoresists. Such photoresists are useful for processes in which substrates are to be etched or are to have material deposited on the surface of the substrate in an imagewise fashion.

BACKGROUND OF THE INVENTION

Background of the Art

Initially, resists were applied to substrates in liquid form. The resist was imagewise subjected to radiation to form relatively soluble and relatively insoluble areas. Upon treatment with an appropriate developer solution, the relatively soluble areas were removed and a physical mask in the desired image pattern was left on the surface of the substrate. The exposed area of the substrate would then be treated by either deposition of material onto the exposed areas (e.g., metal deposition by vapor coating or electrolytic processes) or etching of the surface of the substrate in the area exposed through the mask.

One of the first advances in the use of dry-film photoresist materials was discussed in U.S. Pat. No. 3,469,982 in which a laminable negative-acting single layer film was adhered to a substrate and used as a photoresist.

U.S. Pat. No. 4,193,797 discloses the use of single layer laminable films of positive-acting dry-film photoresist compositions for use in photoresist processes.

Improved dry-film photoresist compositions are disclosed in U.S. Pat. No. 4,247,616. This composition provides good light sensitivity, stability, and excellent resist characteristics.

U.S. Pat. No. 4,349,620 discloses a multi-layer photosensitive film resist (positive- or negative-acting) having a plurality of layers with differing adhesive properties. In particular, a carrier layer having a first photosensitive resist composition thereon and then a second photoresist with different adhesive properties on the first photosensitive composition is disclosed.

Other developments in the art have lead to the use of two layer or multilayer laminable or coatings of photoresist materials in order to improve the sensitometric or physical properties of the dry-film resist. U.K. Pat. No. 1,493,833 shows the use of a photoresist comprising a carrier layer, a photosensitive layer (including positive-acting photosensitive layers) and a non-photosensitive layer which is soluble in aqueous or organic solvents. A host of natural and synthetic polymers are disclosed for these non-photosensitive layers. U.S. Pat. No. 4,204,009 discloses the use of a resist having two photosensitive layers of different reactivities adjacent each other on top of the substrate to be treated. U.S. Pat. No. 4,217,407 discloses the use of multiple layer resist materials which comprise an o-quinone diazide containing layer in combination with at least one other layer which is permeable, swellable, or soluble by alkaline envelopers. A brief list of non-photosensitive compositions is provided.

U.S. Pat. No. 4,191,573 shows a photosensitive image element comprising the support to be plated or etched with two independently applied liquid resists of photosolubilizable layers. The resist layers comprise an azide compound and a polyamide.

U.S. Pat. No. 4,180,604 discloses the use of two separately coated liquid photosensitive resist layers. The compositions appear to be the same, with larger amounts of solvent diluent used in coating the second layer. The lower layer is more readily soluble, promoting undercutting in the formation of the resist image.

U.S. patent application Ser. No. 428,475, filed on Sept. 29, 1982, in the name of P. M. Koelsch and J. P. Vikesland discloses an improved two layer photoresist construction in which one layer is a photosensitive, positive-acting resist composition and the other layer bonding the composite to the surface of the article to be etched or plated is a crosslinked, light-insensitive thermally laminable adhesive layer. The crosslinking provides for reduced undercutting of the resist image.

BRIEF DESCRIPTION OF THE INVENTION

The present invention relates to positive-acting, multilayer, laminable, dry-film photoresist articles which are useful in etching and plating processes. The laminable article comprises at least one positive-acting photoresist layer adhered to a thermoplastic positive-acting adhesive second photoresist layer which contains a lower effective amount of photosolubilizer than contained in the first positive-acting photoresist layer. The second layer is preferably crosslinked or crosslinkable to provide improved physical properties in the composite and in the bonding properties of that second layer.

DETAILED DESCRIPTION OF THE INVENTION

The present positive-acting, laminable dry-film photoresist article comprises at least two functional layers and optionally a strippable carrier layer. One functional layer is a positive-acting dry-film photoresist composition and the second functional layer is a thermally laminable positive-acting photoresist adhesive layer.

Dry-film photoresist compositions are well described in the art. A polymeric binder (either thermoplastic or crosslinked) usually carries within it or pendant from the polymer itself a light-sensitive material or moiety, the solubility of which in selected solvents increases when exposed to radiation. This photosoluble moiety may also be a part of the polymer backbone. The most preferred class of positive-acting photosensitizers are those with o-quinone diazide groups. These materials are generally referred to in the art as o-quinone diazides or diazo oxides. These compounds are well disclosed in the literature as, for example, in U.S. Pat. Nos. 4,349,620; 4,345,020; 4,346,163; 4,193,797; 4,217,407; 4,247,616; 4,211,834; 4,007,047; 3,666,473; 3,201,239 and 4,180,604. These positive-acting photosensitizers are generally used in amounts of from 5 to 80% by weight of the resist layer, and preferably from 10 to 50% of the layer. These patents also describe the various different binders that can be used with the positive-acting o-quinone diazides. The preferred binder material tends to be phenol formaldehyde resins (either novolaks or resoles alone or in combination with crosslinked epoxies as disclosed in U.S. Pat. No. 4,247,616), but a wide variety of various binders are used in the art. These binders include acrylic resins (e.g., alkyl methacrylate, ethylacrylate, copolymers and the like) polymeric polyols (e.g., polyvinyl alcohol, and hydroxy substituted addition polyesters such as polyacrylate and polymethylacrylate polyesters), hydroxy substituted copolymers (such as poly[methyl methacrylate/hydroxy methacrylate]), natural colloids (for example, gelatin and shellac), polyvinyl hydrogenphthalate, ethylene oxide polymers and copolymers, polyacrylamides, polyethylincally unsaturated materials (such as polystyrene and its copolymers), polyamides, polyesters, and the other various polymeric materials both natural and synthetic, thermoplastic and crosslinked as known in the art. The only requirement is that these materials have at least some reasonable solubility in aqueous alkaline or organic developer solutions. The thickness of the first (also the primary) photosensitive layer may generally be between 0.05 and 2.0 mils, preferably between 0.10 and 0.50 mils, most preferably at least 0.1 and less than 0.3 mils.

The thermoplastic adhesive layer is essential to successful commercial practice of dry-film, positive-acting photoresist technology. Monolayer constructions have to date been unable to meet even existing commercial needs for (1) resistance to crazing of the film during storage (because of the brittle nature of the film), (2) photosensitivity, the speed of the film being too slow for commercial processes, and (3) thermal dimensional stability of the film during plating and etching processes. The use of the distinct, non-photosensitive adhesive layer to make the photoresist article laminable according to the teachings of U.S. Ser. No. 428,475, cited above, overcomes all three of these problems. It is the presence of the integral adhesive layer between the photoresist layer and the receptor layer which improves these areas of positive-acting, dry-film photoresist technology, while monlayer constructions have not satisfied the needs of the technology.

The thermoplastic adhesive layer of the present invention is also a photosensitive thermally laminable adhesive layer. This layer must contain a lower effective amount of photosolubilizer (positive-acting photosensitizer) than does the primary photosensitive layer. This enables the more sensitive primary layer to control the imaging while the laminated adhesive layer controls the degree of undercutting. The term "lower effective amount" of photosolubilizer means that the actual amount of the particular photosolubilizer present in the laminable adhesive layer acts at a reduced or less efficient rate in photosolubilizing that layer than does the amount of photosolubilizer in the primary photosensitive layer at a given activating exposure. Thus the increase in solubility of the adhesive layer would be less than the increase in solubility for the top resist layer. For example, if the primary and adhesive layers both comprised a phenol-formaldehyde resin, and the positive-acting photosensitizer in both layers were the same, a lower concentration or percentage of photosolubilizer would be used in the adhesive layer. If the polymeric composition of the primary photosensitive layer and the adhesive layer were the same, but positive-acting photosensitizers of differing speeds were to be used, the slower-acting or less efficient photosensitizer would probably be used in the adhesive up to an amount where it approached but was still less than the effective ability of the photosolubilizer in the primary photosensitive layer to solubilize that layer. A greater amount of less efficient photosolubilizer could be used in the primary layer and a lower effective amount of a more sensitive photosolubilzer could also be used in the adhesive layer. This last variation provides no benefit over the previously described construction. Preferably, the adhesive layer contains an amount of photosolubilizer which is capable of generating greater than 10% and fewer than 90% of the number amount volume of soluble species as does the primary photoresist layer at a given exposure to radiation to which the primary photosensitive layer is sensitive. Preferably, the adhesive layer is capable of generating between 30 and 90% of the number amount/volume of soluble species as does the primary photoresist layer and most preferably it is capable of generating between 40 and 85% of those species. It is preferred to have the same or approximately equivalent photosolubilizers in both layers with a smaller concentration in the adhesive layer.

The laminable adhesive layer as previously noted may comprise either a two-dimensional, three-dimensional (crosslinked) or crosslinkable polymer. A crosslinked polymer is preferred in the present invention.

The crosslinked or crosslinkable laminable layer may be made of any compositions which are soluble in aqueous alkaline or organic solvent solutions and are not sufficiently crosslinked so as to prevent bonding of that layer to a substrate when pressed and heated. Typically, the crosslinked or crosslinkable layer should be capable of adhering to at least one substrate of mildly abraded copper, aluminum, tin, or polyester when pressed against such a surface with a force of no more than ten pounds per square inch at a temperature no greater than 150° C. for no longer than twenty seconds. The layer, to be laminable, must have a major surface exposed or exposable (as by removing a physically strippable cover sheet without melting or chemical treatment) so that it can be laminated. For example, a layer fused to two other layers and being sandwiched by them cannot be laminable. These characteristics define the term laminable in the practice of the present invention. The intrinsically crosslinkable resin (that is, without the external application of chemical crosslinking materials) may already be crosslinked to any degree consistent with its also being laminable and yet be capable of further crosslinkability. This can be achieved by various means known to the ordinarily skilled artisan such as inclusion of photoactivatable crosslinking agents, partial crosslinking of the original composition which may be further crosslinked by heating, etc.

The desirability for crosslinking or crosslinkability in the laminable layer derives from the fact that the many various applications of the dry-film photoresist article will require different properties in the various applications. This is why the crosslinkable ability of the layer, which is controlable by the degree of crosslinking stimulation given that layer, is the preferred embodiment of the present invention. Crosslinking is an improvement over the general use of thermoplastic materials as the laminable layer in the prior art because of the improved control of solubility which can be given those layers. The crosslinkable compositions must be crosslinkable to a degree that satisfies the definition of crosslinked according to the present invention.

The control of solubility in thermoplastic laminable layers quickly reaches a point of diminishing returns. Particularly when organic solvents are being used as a developer, increasing the molecular weight of thermoplastic polymers used in the laminable layer becomes more difficult and less productive in reducing the natural solubility of that layer in developer solvents. Doubling the molecular weight of a thermoplastic polymer from 500,000 to a million, for example, does not provide for facile control of solubility properties and does not easily produce a polymer with consistent properties because of the significant distribution of molecular weights within the polymerized material. Controlled crosslinking, on the other hand, tends to provide a more consistent composition with more accurately controlled solubility properties. This is particularly true with respect to thermal dimensional stability in the laminated resist which is extremely important in many fine detail processes where elevated temperatures are used, such as in plating processes.

Any polymeric material which can be crosslinked and in its incompletely crosslinked stage (i.e., at least partially crosslinked), is soluble in aqueous alkaline solutions or organic solvents is useful in the practice of the present invention. By crosslinked, it is understood that the polymeric composition has at least some three dimensional structure to it and is at least ten percent (preferably at least 15 or 20 percent and more preferably 25 or 50 percent) less soluble (either in absolute amounts or in its rate of solubilization) in the selected developer solution than the polymeric composition without the crosslinking therein. Amongst the various classes of materials that can be used for the laminable layer are phenol formaldehyde resins (including novolaks), epoxy resins, acrylic resins (and copolymers), polyesters, polyamides, and the like. Each of these materials is well known in the art to be crosslinkable or can be mixed with a crosslinked resin, and the skilled artisan is well aware of the various crosslinking agents which can be used for the various polymeric materials. These, for example, include diisocyanates and epoxies, diacid chlorides, dianhydrides, diacids, polyisocyanates, polyepoxides, polyacids, aziridines, azlactones, dihalides, polyhalides, and the like. When already crosslinked, the laminable layer must remain laminable. No crosslinked layer should be in combination with the photosensitive resist layer prior to lamination if it is so crosslinked that it is neither laminable nor soluble in both aqueous alkaline solutions and organic solvent solutions. This control is well understood by those of ordinary skill in the art and can be determined for any crosslinkable material and any particular crosslinking agent by routine experimentation. Mixtures of these crosslinkable materials together or in combination with thermoplastic materials may be readily practiced by one of ordinary skill in the art. For example, the composition of U.S. Pat. No. 4,247,616 may be used as the laminable layer as well as the binding composition for the positive-acting photosensitizers. The preferred compositions of the present invention for the laminable layer comprise phenol formaldehyde resins blended with acrylic resins and particularly resole resins and acrylic terpolymers. A typical developer solution for determining relative solubility for crosslinked materials, as defined above, would be aqueous sodium hydroxide solutions of pH 13.0 to 13.5.

The photosensitive and laminable layers may vary in thickness depending on their particular needs. Generally the various layers will range from 2 to 25 microns, preferably from 4 to 15 microns, and most preferably from 6 to 12 microns for the primary photosensitive resist layer and the adhesive layer. The laminable photosensitive layer may be of the same, smaller, or larger thickness, but should remain within the broad limits given for the photosensitive resist layer. The composite should be at least 4 and preferably at least 6 microns to enable physical transfer of the composite without structural damage thereto such as wrinkling and folding.

Various other ingredients may be included in these layers as is well understood in the art. Surfactants, spectral sensitizers, dyes, fillers, lubricants, coating aids, spectral absorbers (such as ultraviolet radiation absorbers) and the like may be used as is understood in the art. These and other aspects of the present invention will be disclosed in the following examples.

EXAMPLE 1

A photosensitive coating solution was prepared by mixing the following:

| | |
|---|---|
| Acetone | 40 g |
| "Resinox", a novolak phenolic (phenol-formaldehyde) resin | 60 g |
| Acryloid AT-70, a styrene, ethylacrylate acrylic acid terpolymer (50% solids resin in a xylene and Glycol monomethyl ether acetate 50/50 solvent) | 4 g |
| DMP-30, 2,4,6-tris(dimethylaminomethyl) phenol amine catalyst | 0.2 g |
| DDI-1410, a 36 carbon atom aliphatic diisocyanate | 1.3 g |
| Phenyl isocyanate | 2.5 g |

After a reaction time of two hours, this solution was mixed with the following additional materials:

| | |
|---|---|
| DER 732, propylene glycol di(2,3-glycidylpropyl)ether | 3.2 g |
| Diaminodiphenylsulfone | 1.3 g |
| Phthalic anhydride | 0.4 g |
| 2,4-dihydroxybenzophenone bis-[naphthoquinone-(1,2)-diazide-(2)-5-sulfonate] the photosensitizer | 7.4 g |

This solution was then coated onto a polyester web bearing a release layer of "Gantrez" S-95, an acidified copolymer of maleic anhydride and methyl vinyl ether. The drying temperature was 100° C. for 3 minutes. The dry thickness of the photosensitive layer was 0.2–0.3 mil. Other photosensitive coatings as described in U.S. Pat. No. 4,247,616 may be used.

The solution providing the laminable photosensitive layer was coated onto the dried photosensitive layer to a thickness of 0.25–0.35 mil after drying at 100° C. for 3 minutes. The preferred coating solution is:

| | |
|---|---|
| 30 g | Acetone |
| 5.4 g | BKR 2620, a resole type phenol formaldehyde resin |
| 0.05 g | Triethylenediamine |
| 0.2 g | DDI-1410, a 36 carbon atom aliphatic diisocyanate |
| 2.0 g | "Carboset" 525, ethyl acrylate, methyl acrylate, acrylic acid terpolymer |
| 2.5 g | 2,4-dihydroxybenzophenone bis-[naphthoquinone-(1,2)-diazide-(2)-5-sulfonate] photosolubilizer. |

The coated dry-film was laminated at a rate of 3 ft/minute to a copper foil using a heated-roll laminator set at 110° C. The laminated resist was then exposed through a photomask and developed with an approximately 1.0% solution of sodium hydroxide. The resulting image quality was excellent down to a linewidth resolution of 0.2 mil. The identical construction without any photosensitizer in the solution provided linewidth resolution of only 0.5 mil. This composition is thermally stable, giving negligible movement of the edge profile of the resist at bath temperature up to 170° F. (which is higher than the maximum temperature of commonly employed electroplating solutions). Chemical resistance to FeCl$_3$ etchant at 150° F. was outstanding.

A non-crosslinked composition identical to that used as the non-photosensitive composition of Example 1 was prepared, except that the triethylenediamine (crosslinking catalyst) and the diisocyanate (DDI-1410 crosslinking agent) were excluded. That composition was coated onto the photosensitive layer and dried in the same manner as in Example 1. The bilayer was then laminated, exposed and developed as in that example. Microscopic examination of the developed photoresist showed significant image undercutting and loss of resolution in the non-crosslinked, bilayer image.

EXAMPLES 2–3

In addition to the above example, the following compositions have also been successfully employed as the adhesive layer with the same lower effective amounts of photosensitizer used in Example 1.

| A. | 38.1 g | Acetone |
| | 5.1 g | BKR 2620 |
| | 3.1 g | Carboset 525 |
| | 0.13 g | Gantrez AN119, (maleic anhydride, methyl vinyl ether copolymer) |
| B. | 40 g | Acetone |
| | 0.05 g | Triethylene diamine |
| | 5.4 g | BKR 2620 |
| | 0.1 g | Phenylisocyanate |
| | 2.0 g | Carboset 525 |

Composition B is a crosslinkable composition. When initially laminated, the composition was capable of being undercut by development. By heating the laminated composition, the crosslinking reaction was initiated and various degrees of crosslinking could be generated. In this manner the precise degree of undercutting of the mask or image could be controlled offering a highly desirable degree of latitude in processing. Heating of composition B at 250° F. for fifteen minutes after lamination produced an adhesive layer that was barely undercut by the developer (aqueous alkaline solution at pH 13+).

EXAMPLE 4

A photosensitive coating solution was prepared by mixing the following:

| Acetone | 40 g |
| Resinox, a novolak phenolic resin | 20 g |
| Acryloid AT-70, a styrene, ethylacrylate acrylic acid terpolymer (50% solids) | 4 g |
| DMP 30, amine catalyst | 0.2 g |
| DDI 1140, an aliphatic diisocyanate | 1.3 g |
| Phenyl isocyanate | 2.5 g |

After a reaction time of two hours, this solution was mixed with the following additional materials:

| DER 732, a bis epoxy | 3.2 g |
| Diaminodiphenylsulfone | 1.3 g |
| Phthalic anhydride | 0.4 g |
| 1,2 naphthaloquinone diazide 5-p-tert-butyl phenylsulfonate | 7.4 g |

This solution was then coated onto a polyester web bearing a release layer of Gantrez S-95, an acidified copolymer of maleic anhydride and methyl vinyl ether. The drying temperature was 100° C. for 3 minutes. The dry thickness of the photosensitive layer was 0.25 mil.

The secondary photosensitive solution was coated to a thickness of 0.25–0.35 mil after drying at 100° C. for 3 minutes. The preferred non-photosensitive coating solution is:

| 30 g | Methyl ethyl keytone |
| 5.4 g | BKR 2620 |
| 0.05 g | Triethylenediamine |
| 0.2 g | DDI 1410 |
| 2.0 g | Carboset 525, ethyl acrylate, methyl acrylate, acrylic acid terpolymer |
| 1.0 g | 1.2 naphthaloquinone diazide 5-p-tert-butyl phenylsulfonate |

The coated dry film was laminated at a rate of 3 ft/minute to a copper foil using heated roll laminator set at 110° C. The laminated resist was then exposed through a photomask and developed with an approximately 1.0% solution of sodium hydroxide. The resulting image quality was excellent down to a linewidth resolution of 4 micrometers by immersion development.

What is claimed is:

1. A dry-film, positive acting, laminable photoresist of at least two layers comprising:
    (a) a first layer of a positive-acting photoresist layer, comprising an organic polymeric binder having at least one positive-acting photosensitizer therein, said first layer becoming more soluble in an aqueous alkaline solution or organic solvent after exposure to actinic radiation, and
    (b) a second photoresist layer laminable to a receptor layer, adjacent and adhered to a surface of said first layer, of a thermally laminable adhesive organic polymer which second layer becomes more soluble in an aqueous alkaline solution or organic solvent after exposure to actinic radiation and which second photoresist layer contains a lower effective amount of positive-acting photosensitizer than said first layer said organic photoresist layer consisting essentially of organic polymeric binder and positive-acting photosensitizer, and said second photoresist layer being capable of generating between 30 and 90% of the number amount per volume of soluble species from said photosensitizer as compared to said first layer, said photoresist having reduced undercutting as compared to a photoresist without photosensitizer in said second layer.

2. The photoresist of claim 1 wherein a strippable carrier layer is adhered to said first layer.

3. The photoresist of claim 2 wherein the organic polymer of said second layer is crosslinkable by the application of heat thereto.

4. The photoresist of claim 3 wherein said organic polymer of said second layer comprises a phenol formaldehyde resin and an acrylic polymer.

5. The photoresist of claim 4 wherein the positive-acting photosensitizer of said first and second layer comprises the same compounds and the concentration of said compound in said second layer is between 40 and 85% of the concentration of said compounds in said first layer.

6. The photoresist of claim 2 wherein said first photoresist layer comprises an o-quinone diazide in an organic polymeric binder and the organic polymer of said second layer is crosslinked.

7. The photoresist of claim 6 wherein said organic polymer of said second layer comprises a phenol formaldehyde resin and an acrylic polymer and said first and second layers are at least 2 micrometers in thickness.

8. The photoresist of claim 6 wherein the positive-acting photosensitizer of said first and second layer comprises the same compounds and the concentration of said compound in said second layer is between 40 and 85% of the concentration of said compounds in said first layer.

9. The photoresist of claim 6 wherein said organic polymeric binder comprises a phenol formaldehyde resin.

10. The photoresist of claim 9 wherein the positive-acting photosensitizer of said first and second layer comprises the same compounds and the concentration of said compound in said second layer is between 40 and 85% of the concentration of said compounds in said first layer.

11. The photoresist of claim 9 wherein the orgaic polymer of said second layer comprises an acrylic polymer.

12. The photoresist of claim 11 wherein the positive-acting photosensitizer of said first and second layer comprises the same compounds and the concentration of said compound in said second layer is between 40 and 85% of the concentration of said compounds in said first layer.

13. The photoresist of claim 11 wherein said second layer comprises (1) an acrylic copolymer or terpolymer and (2) a phenol formaldehyde resin crosslinked with a polyisocyanate.

14. The photoresist of claim 1 wherein the positive-acting photosensitizer of said first and second layer comprises the same compounds and the concentration of said compound in said second layer is between 40 and 85% of the concentration of said compounds in said first layer.

* * * * *

UNITED STATES PATENT AND TRADEMARK OFFICE
CERTIFICATE OF CORRECTION

PATENT NO. : 4,571,374

DATED : February 18, 1986

INVENTOR(S) : John P. Vikesland

It is certified that error appears in the above-identified patent and that said Letters Patent is hereby corrected as shown below:

Column 10, line 1, "orgaic" should read --organic--.

Signed and Sealed this

Third Day of November, 1987

Attest:

DONALD J. QUIGG

Attesting Officer

Commissioner of Patents and Trademarks